United States Patent
Wang et al.

(10) Patent No.: US 10,943,043 B1
(45) Date of Patent: Mar. 9, 2021

(54) MULTIPLE OUTPUT CONSTRAINED INPUT LOOKUP TABLE GENERATION

(71) Applicant: XILINX, INC., San Jose, CA (US)

(72) Inventors: Jichun Wang, San Jose, CA (US); Chun Zhang, San Jose, CA (US); Fan Zhang, San Jose, CA (US); Bing Tian, San Jose, CA (US)

(73) Assignee: XILINX, INC., San Jose, CA (US)

( * ) Notice: Subject to any disclaimer, the term of this patent is extended or adjusted under 35 U.S.C. 154(b) by 0 days.

(21) Appl. No.: 16/831,229

(22) Filed: Mar. 26, 2020

(51) Int. Cl.
| G06F 30/30 | (2020.01) |
| G06F 30/34 | (2020.01) |
| G06F 30/327 | (2020.01) |
| G06F 30/337 | (2020.01) |
| G06F 30/343 | (2020.01) |
| G06F 30/323 | (2020.01) |

(52) U.S. Cl.
CPC ............ *G06F 30/34* (2020.01); *G06F 30/323* (2020.01); *G06F 30/327* (2020.01); *G06F 30/337* (2020.01); *G06F 30/343* (2020.01)

(58) Field of Classification Search
None
See application file for complete search history.

(56) References Cited

U.S. PATENT DOCUMENTS

| 6,118,300 A | 9/2000 | Wittig et al. |
| 9,646,126 B1 | 5/2017 | Lu et al. |
| 2001/0030555 A1 | 10/2001 | Witting et al. |

*Primary Examiner* — Leigh M Garbowski
(74) *Attorney, Agent, or Firm* — Patterson + Sheridan, LLP

(57) ABSTRACT

Examples described herein provide a method for optimizing a netlist for an integrated circuit device. The method generally includes receiving a netlist comprising a first lookup table, and upstream logic, wherein the upstream logic receives a plurality of input signals and comprises at least one output connected as at least one input to the first lookup table, wherein the first lookup table comprises an unused input and multiple outputs; mapping the plurality of input signals directly to the at least one input and the unused input of the first lookup table; validating the mapping by monitoring the multiple outputs of the first lookup table; and upon a successful validation, optimizing the netlist by removing the upstream logic and reconnecting the plurality of input signals to the at least one input and the unused input of the first lookup table.

20 Claims, 10 Drawing Sheets

US 10,943,043 B1

MULTIPLE OUTPUT CONSTRAINED INPUT LOOKUP TABLE GENERATION

TECHNICAL FIELD

Examples of the present disclosure generally relate to electronic circuit design and, in particular, to optimizing netlists with lookup tables with multiple outputs and constrained inputs.

BACKGROUND

Programmable integrated circuits (ICs) are often used to implement digital logic operations according to user configurable input. Example programmable ICs include complex programmable logic devices (CPLDs) and field programmable gate arrays (FPGAs). CPLDs often include several function blocks that are based on a programmable logic array (PLA) architecture with sum-of-products logic. A configurable interconnect matrix transmits signals between the function blocks.

A conventional design process for programmable ICs begins with the creation of the design. The design is then compiled for implementation in a particular programmable IC device. During compilation, a circuit design can be "synthesized" to produce a representation of the circuit design in terms of specific logic elements, which can be optimized to the architecture of the programmable IC (e.g., lookup tables (LUTs), carry logic, IO buffers, etc.). To generate an optimal implementation in terms of area in the programmable IC, the synthesis process can attempt to combine some logic elements together, including logic elements upstream from a programmable LUT with the programmable LUT.

SUMMARY

Examples of the present disclosure generally relate to optimizing netlists for integrated circuit devices in an effort to improve quality of results and to improve runtime.

One example of the present disclosure is a method for optimizing a netlist for integrated circuit devices. The method generally includes: receiving a netlist, a first lookup table, and upstream logic, wherein the upstream logic receives a plurality of input signals and comprises at least one output connected to at least one input to the first lookup table, wherein the first lookup table comprises an unused input and multiple outputs; mapping the plurality of input signals of the upstream logic directly to the at least one input and the unused input of the first lookup table; validating the mapping by monitoring the multiple outputs of the first lookup table; and upon a successful validation, optimizing the netlist by removing the upstream logic and reconnecting the plurality of input signals of the upstream logic to the at least one input and the unused input of the first lookup table.

Aspects of the present disclosure also provide apparatus, methods, processing systems, and computer readable mediums for performing the operations described above.

These and other aspects may be understood with reference to the following detailed description.

BRIEF DESCRIPTION OF THE DRAWINGS

So that the manner in which the above recited features can be understood in detail, a more particular description, briefly summarized above, may be had by reference to example implementations, some of which are illustrated in the appended drawings. It is to be noted, however, that the appended drawings illustrate only typical example implementations and are therefore not to be considered limiting of its scope.

To facilitate understanding, identical reference numerals have been used, where possible, to designate identical elements that are common to the figures. It is contemplated that elements of one example may be beneficially incorporated in other examples.

DETAILED DESCRIPTION

Figure 1:
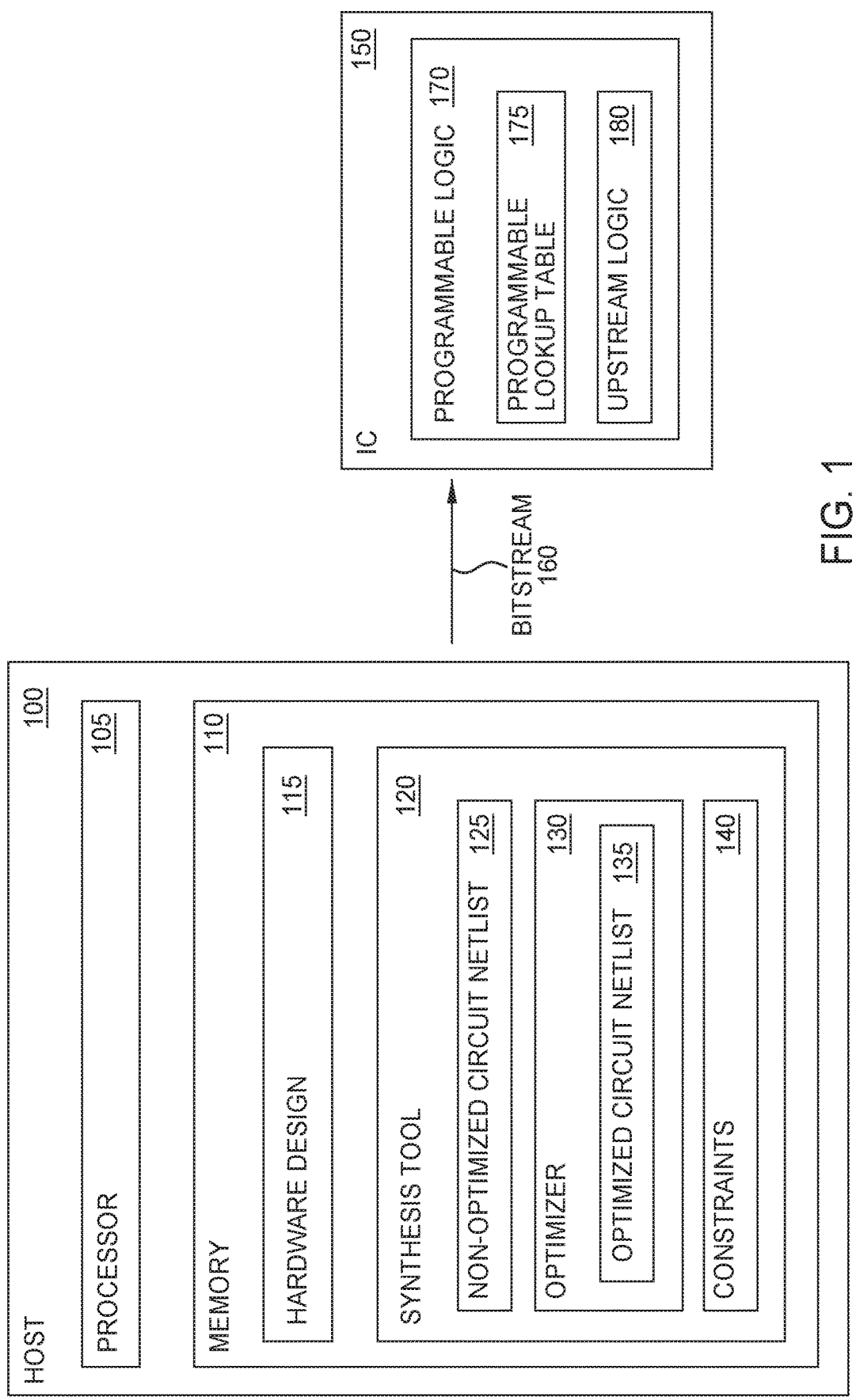
FIG. 1 depicts an example of a circuit design system, in accordance with an example of the present disclosure.

Various features are described hereinafter with reference to the figures. It should be noted that the figures may or may not be drawn to scale and that the elements of similar structures or functions are represented by like reference numerals throughout the figures. It should be noted that the figures are only intended to facilitate the description of the features. They are not intended as an exhaustive description of the description or as a limitation on the scope of the claims. In addition, an illustrated example need not have all the aspects or advantages shown. An aspect or an advantage described in conjunction with a particular example is not necessarily limited to that example and can be practiced in any other examples even if not so illustrated, or if not so explicitly described.

Examples described herein involve techniques for optimizing a netlist representing a hardware design for an integrated circuit (IC) device. Specifically, the method involves optimizing a netlist with a programmable LUT having multiple correlated outputs and hard input constraints. A multiple output constrained input LUT is a LUT that generates multiple outputs based on inputs that are constrained by netlist constraints, system constraints, etc. The outputs of this LUT are also correlated in that the outputs may depend on each other based on the logical structure of the programmable LUT. In one example, the optimizer receives a netlist comprising a first lookup table and upstream logic. The upstream logic receives a plurality of input signals and comprises at least one output connected to an input of the first lookup table. The first lookup table may comprise an available (i.e., unused) input and multiple outputs. The optimizer maps the plurality of input signals previously routed to the upstream logic directly to the inputs of the first lookup table, which includes the available input and the input connected to the output of the upstream logic. The optimizer validates the mapping by monitoring the multiple outputs of the first lookup table. If the validation succeeds, then the optimizer proceeds with optimizing the netlist by removing the upstream logic and reconnecting the plurality of input signals from the upstream logic to the inputs of the first lookup table.

In some examples, logic elements (e.g., XORCY and MUXCY) which were previously part of hardened carry-chain circuits are instead mapped in programmable fabric (e.g., programmable LUTs) of the IC device. This mapping to the programmable fabric has led to new requirements to LUT mapper tools. One of the new requirements involves the mapping algorithm absorbing upstream logic. Another requirement involves mapping three-output functions with two of the outputs being correlated. The mapping algorithm may also be required to honor hard input constraints, which are constraints on an input signal and allowing for no violation of the constraint bounds on the input any time. For example, one designated input pin of a programmable LUT needs to be connected to an output of multiplexer logic.

According to the examples described herein, the optimizer meets the requirements for LUT mapper tools and can synthesize legal designs critical for timing quality of results (QoR) improvements. The optimizer also expands to solve any correlated multi-output functions mapping with hard input constraints for programmable lookup table.

FIG. 1 is a block diagram depicting an example of a circuit design system with a netlist optimizer, according to an example. The host 100 includes a processor 105 which represents any number of processing elements which each can include any number of processing cores. The host 100 also includes a memory 110 which can include volatile or non-volatile memory elements. The processor 105 can execute executable code from memory 110 representing operations of the optimization techniques disclosed herein.

The memory 110 includes a hardware design 115, and a synthesis tool 120. In one embodiment, the hardware design 115 is expressed in hardware description language (HDL) that describes, at a high-level, a hardware system. For example, the hardware design 115 may describe the hardware system using functional blocks rather than specific circuit elements (e.g., logic gates or LUTs).

The synthesis tool 120 converts the high-level HDL in the hardware design 115 into a non-optimized circuit netlist 125. In one embodiment, the synthesis tool 120 (or another compiler) performs a "rough" or intermediate synthesis to convert the HDL in the hardware design 115 into circuit elements which are represented in the netlist 125. The circuit formed by these circuit elements (i.e., the circuit defined by the netlist 125) is non-optimized. The non-optimized circuit netlist 125 may also be called a non-optimized combinational circuit.

The synthesis tool 120 includes an optimizer 130 which, using an optimization strategy, optimizes the non-optimized circuit netlist 125 to generate an optimized circuit netlist 135. As described in more detail below, the optimizer 130 uses the techniques disclosed herein to optimize the non-optimized circuit netlist 125 having a multiple output constrained input lookup table. The optimized circuit netlist 135 can then be used to generate the represented hardware circuitry in an IC 150.

In one example, the netlist 135 is provided to a fabrication system which produces an ASIC that includes the circuitry defined by the netlist 135. In another embodiment, the optimized circuit netlist 135 is converted into a bitstream 160 that is transmitted to a programmable IC 150 to program logic elements 170, including LUTs 175 and upstream logic 180, defined by the netlist 135.

In some examples, the synthesis tool 120 also includes constraints 140 for optimizing the non-optimized circuit netlist 125. The constraints 140 can include hard input constraints. Some hard input constraints may require an input to a logic element to be connected to the output of another logic element. The optimizer may honor these constraints 140 during optimization, and in some cases, some constraints 140 may push the optimizer to fallback and generate buffer LUTs.

Figure 2:
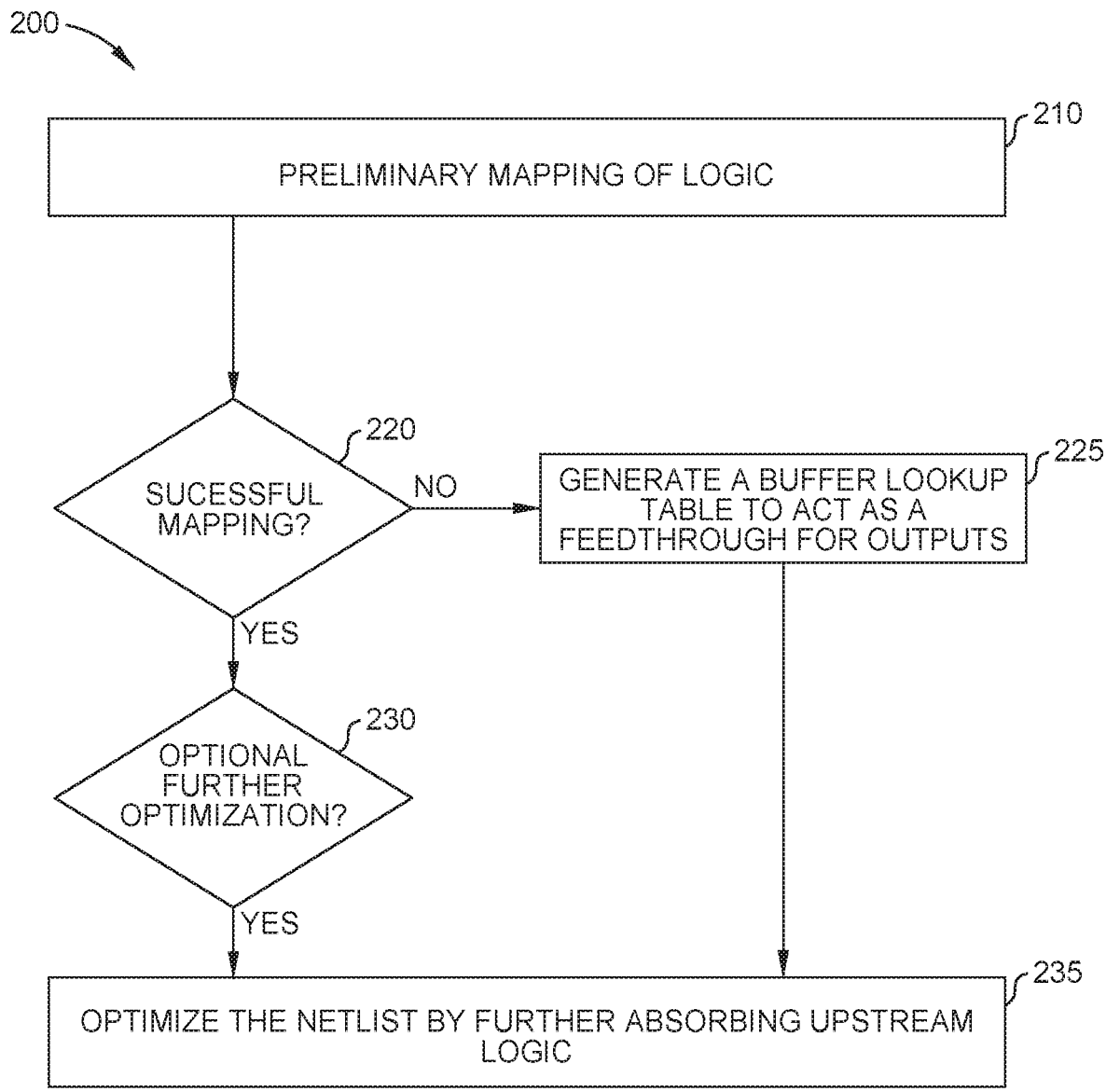
FIG. 2 is a flow diagram depicting an example of a method optimizing a circuit design for an IC, in accordance with an example of the present disclosure.

FIG. 2 is a flowchart of a method 200 for optimizing a netlist using the circuit design system of FIG. 1, according to an example. The processor 105 can execute any part of method 200 during synthesis or post synthesis. In some examples, the processor 105 executes code from memory 110 for the optimizer 130, and the optimizer 130 performs method 200 on the non-optimized netlist 125.

As mentioned, the non-optimized netlist can represent a hardware design for the programmable IC 150 of FIG. 1. In some examples, the synthesis tool 120 can perform a rough or intermediate compilation or synthesis of the hardware design to convert HDL code (e.g., a register transfer level (RTL) design) into the non-optimized netlist. In such example, the synthesis tool then passes the non-optimized netlist to the optimizer tool 130.

At 210, the host preliminarily maps the logic elements of the netlist. The preliminary mapping of the netlist can occur during synthesis and can involve connecting logic elements together via their inputs and outputs. In some examples, the host can preliminarily map input signals to a programmable lookup table in the netlist. The preliminary mapping of the netlist can be optimized using optimization techniques described herein. In some cases, the preliminary mapping of the netlist can be involve mapping details disclosed with reference to FIG. 4.

At 220, the optimizer determines whether mapping of 210 was successful. If the mapping was successful, the optimizer may have an optimized netlist. In some cases, the optimized netlist can be further optimized, and so at 230, the optimizer determines whether further optimization of the netlist is available. If further optimization is available, then the optimizer performs further optimization discussed with reference to FIG. 3. If the mapping was unsuccessful, at 225, the optimizer generates a buffer LUT to act as a feedthrough for the outputs of the upstream logic and thus the optimizer generates an un-optimized netlist.

Figure 6:
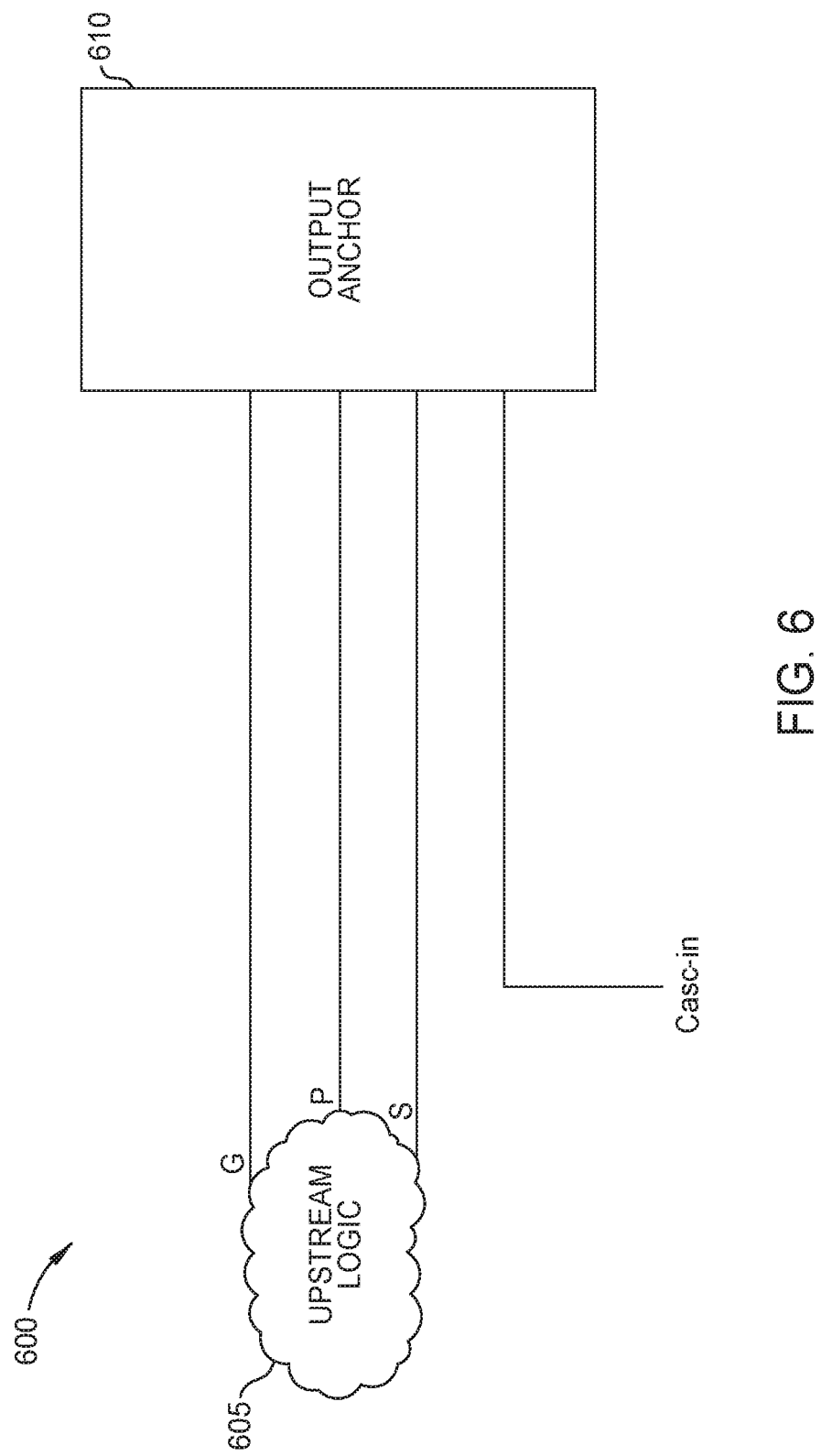
FIG. 6 illustrates anchoring of outputs signals from upstream logic, in accordance with an example of the present disclosure.
Figure 7:
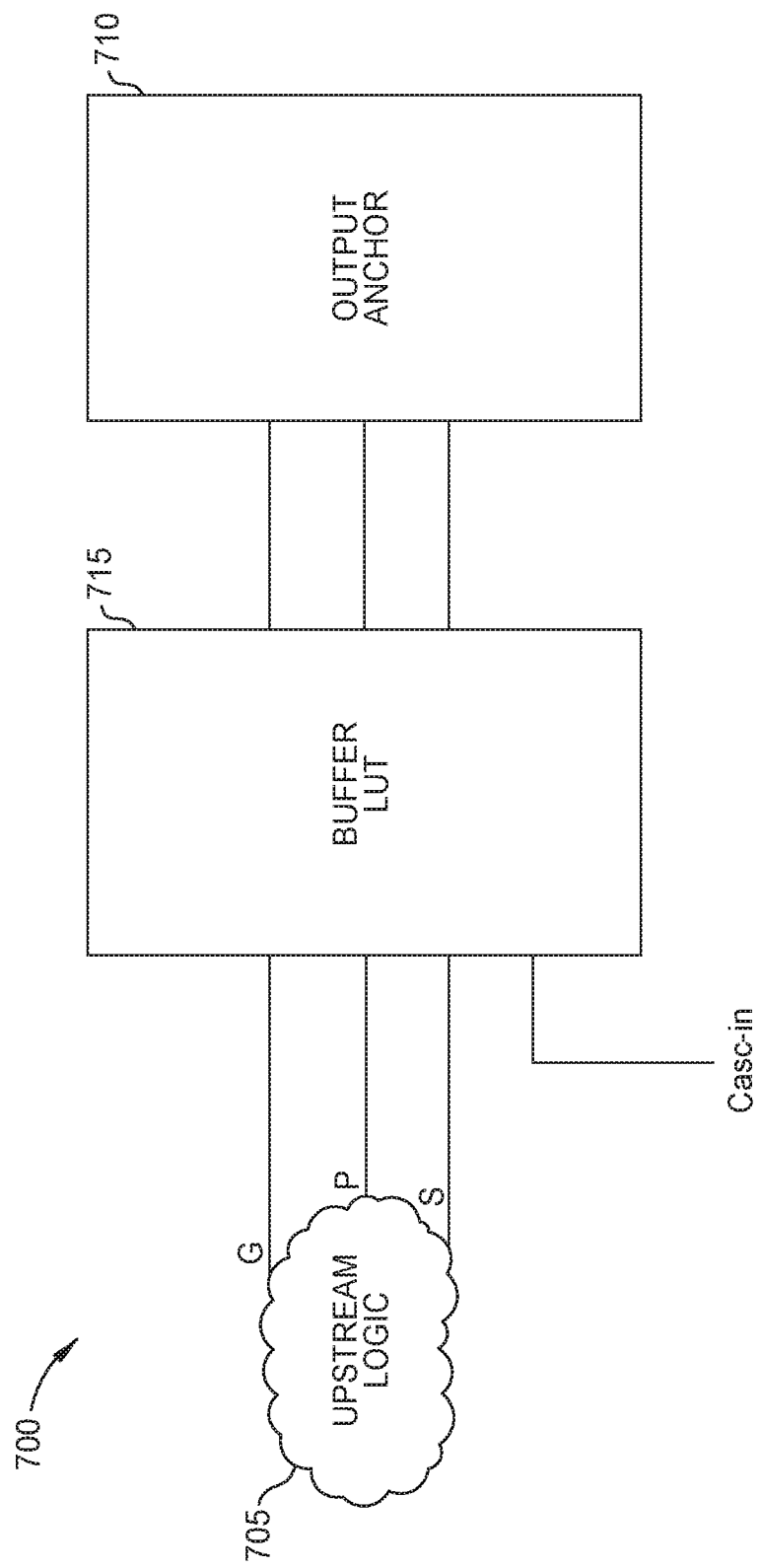
FIG. 7 illustrates mapping of signals from upstream logic to a programmable LUT, in accordance with an example of the present disclosure.

FIG. 7 illustrates a generated feedthrough buffer LUT for outputs from the upstream logic. The buffer LUT 715 can replace at least some of the upstream logic 705 by re-organizing some of the upstream logic 705 to fit into the generated buffer LUT 715. As illustrated, the buffer LUT 715 is added between the upstream logic 705 and an output anchor 710, and passes the output signals from the upstream logic 705 to the output anchor 710. More details about the output anchor 710 are provided with reference to FIG. 6.

The optimizer can also use buffer LUTs to comply with constraints and requirements of the upstream logic. For example, the optimizer can generate buffer LUTs to feedthrough output signals of the upstream logic to comply with constraints and requirements of cascading logic. In some cases, constant propagation may have wiped out entire logic structures or elements, or may have restructured the logic structures/elements away from another logic element to which they were originally connected. Accordingly, the optimizer can validate whether the hardware design represented by the netlist is still legal. If the netlist no longer represents a legal circuit design, as a fallback mechanism, the optimizer may implement buffer LUTs to feedthrough output signals of the upstream logic. Depending on the propagated constants or input signals, the optimizer may implement the programmable LUT as constant buffers or may implement feedthrough buffers feeding signals to anchor points with respect to each output.

After generating the buffer LUTs, at 235, the optimizer may also perform further optimization on the netlist by absorbing upstream logic. In some cases, the optimizer may need to optimize the netlist post-synthesis. For example, after synthesis, the circuit design represented by the netlist may still suffer from insufficient optimization, or may have been retargeted from previous architectures. The optimization techniques disclosed herein may apply post synthesis because the netlist may still be optimized. In some examples, more LUTs can be pulled into the programmable LUT if sufficient inputs exist. For example, the optimizer can combine a three-input one-output LUT with the programmable LUT if the programmable LUT has two unused inputs. The optimizer can thereby combine other upstream logic with the programmable LUT to pack the logic of the netlist more compactly.

Figure 3:
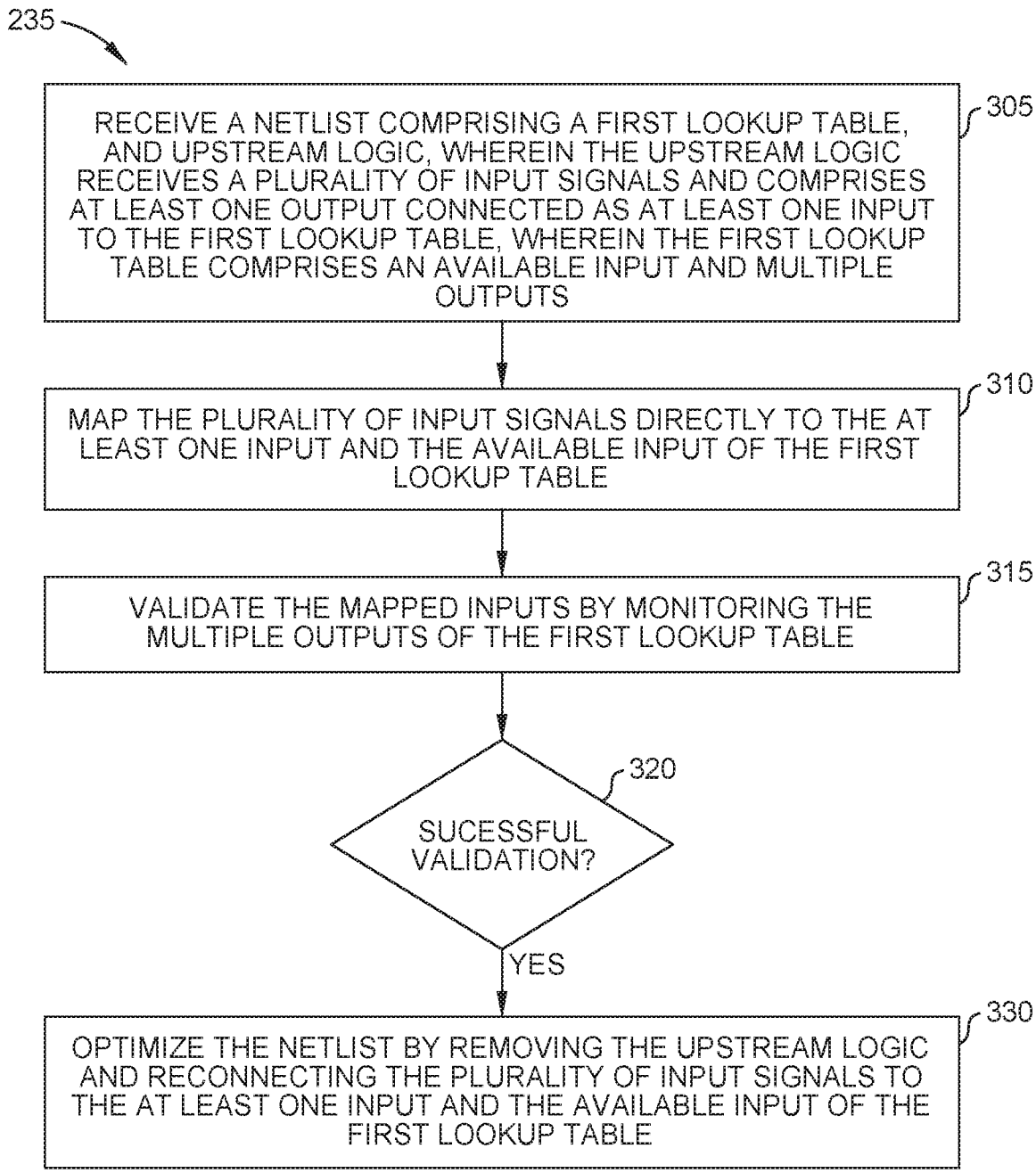
FIG. 3 is a flow diagram depicting further details of optimizing a circuit design for an IC, in accordance with an example of the present disclosure.

FIG. 3 is a flow diagram illustration operations performed by the optimizer to further optimize the netlist by absorbing upstream logic, according to an example. The processor 105 can execute any part of method 200 during synthesis or post synthesis. In some examples, the processor 105 executes code from memory 110 for the optimizer 130, and the optimizer 130 performs method 300 on the non-optimized netlist 125.

At 305, the optimizer receives a netlist comprising a programmable LUT and upstream logic. The netlist can be a netlist optimized during synthesis, or a non-optimized or unmapped netlist resulting from an unsuccessful mapping using method 200 of FIG. 2.

In some examples, the netlist includes upstream logic, which may correspond to the upstream logic 180 of the programmable IC 150. The upstream logic can receive a plurality of input signals and can comprise at least one output connected as an input to the programmable LUT. Accordingly, the upstream logic is logically upstream to the programmable LUT and provides the input signals to the programmable LUT. For example, in FIG. 8, the upstream logic 805 comprises input signals 815a, 815b, 815c (collectively, 815), 820a, and 820b (collectively, 820), and the output 825 of the upstream logic 805 is connected to the LUT 810, which has two unused inputs 830a, 830b (collectively, 830). Accordingly, the upstream logic can include logic elements that can be logically connected to inputs of the programmable LUT. The upstream logic can include any number and combination of logic elements. For example, the upstream logic can include adders, multiplexers, XOR gates, etc. The upstream logic can also include any number of LUTs.

In some examples, when the optimizer receives the netlist, the optimizer anchors output signals from the upstream logic. Anchoring output signals can preserve these signals during the optimization process and prevent the optimizer from inadvertently removing any one of the output signals from the netlist.

FIG. 6 illustrates anchoring of the output signals from the upstream logic 605. The optimizer can anchor the output signals G, P, and S to preserve these signals during optimization, in case a logic element in the upstream logic 605 is inadvertently removed from the netlist. In further examples, the optimizer can preserve some logic elements in the netlist. Anchoring the output signals can involve inserting anchor buffers, such as output anchor 610, into the netlist. These output anchors can be logic elements, such as a LOOKAHEAD8 logic element, which can assist in preserving the output signals. In some cases, the optimizer may use other optimization techniques before or during the optimization techniques disclosed herein. Accordingly, anchoring the output signals helps the optimizer in locating the output signals after the netlist is optimized into different structures. Furthermore, anchoring the output signals creates mapping points facilitating multi-output function mapping, which may help in complying with hard input constraints.

The non-optimized netlist also includes a first programmable LUT. The programmable LUT can comprise an available or unused input, which is not connected to the upstream logic or to any other logic element, and multiple outputs. That is, the programmable LUT has multiple input ports and multiple output ports. The programmable LUT may correspond to a truth table that sets out outputs of the programmable LUT based on a combination of inputs into the programmable LUT. In some examples, some of the outputs of the programmable LUT are correlated. These correlated outputs may be dependent on each other. That is, the internal structure of the programmable LUT may involve internal signaling that would cause this dependency. The dependency of these correlated outputs may be a constraint on the optimization process. Details on the correlation of the outputs of the programmable LUT are discussed with reference to FIG. 9.

At 310, the optimizer proceeds again to perform a mapping of the plurality of input signals (e.g., input signals 815) to inputs (e.g., inputs 825, 830) of the programmable LUT. Details about mapping the plurality input signals are described with reference to FIG. 4.

Figure 4:
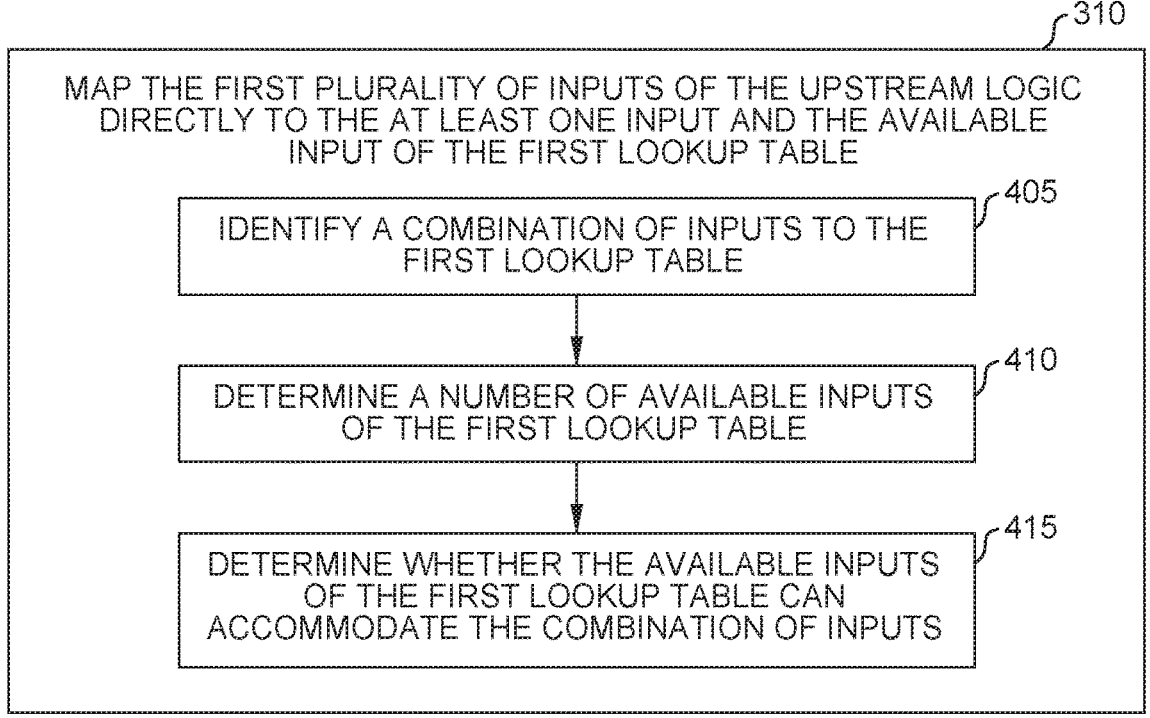
FIG. 4 is a flow diagram depicting an example of a method optimizing a circuit design for an IC, in accordance with an example of the present disclosure.

FIG. 4 is a flow diagram illustration operations performed by the optimizer to map (mapping 310 of FIG. 3) the plurality of the input signals to inputs of the programmable LUT.

To map the plurality of input signals to the inputs of the programmable LUT, at 405, the optimizer identifies a combination of the inputs (e.g., signals 815, 820 of FIG. 8) to the programmable LUT. The optimizer can identify a combination of the inputs that can be reconnected from the upstream logic to the programmable LUT. In some examples, the optimizer may iterate through combinations of input signals to the upstream logic to determine whether any of the iterated combinations can be mapped directly to the programmable LUT. The combination of inputs to the programmable LUT can be any number, arrangement, and/or combination of input signals to the upstream logic. The optimizer may identify a combination of inputs from the input signals based on constraints and other input requirements for the programmable LUT.

At 410, the optimizer determines whether the programmable LUT has any available inputs (e.g., inputs 830 of FIG. 8) and if so, the optimizer determines the number of available inputs to the programmable LUT. In some examples, an available input to the programmable LUT is an input port of the programmable LUT that is not connected to any input signal or any constant signal, and thus, is currently unused.

At 415, the optimizer determines whether the available inputs of the programmable LUT can accommodate the combination of inputs. That is, the optimizer can compare the number of available inputs to the programmable LUT against the number of inputs of the combination. In some examples, the number of available inputs needs to be equal to or greater than the number of inputs of the combination of inputs.

Figure 8:
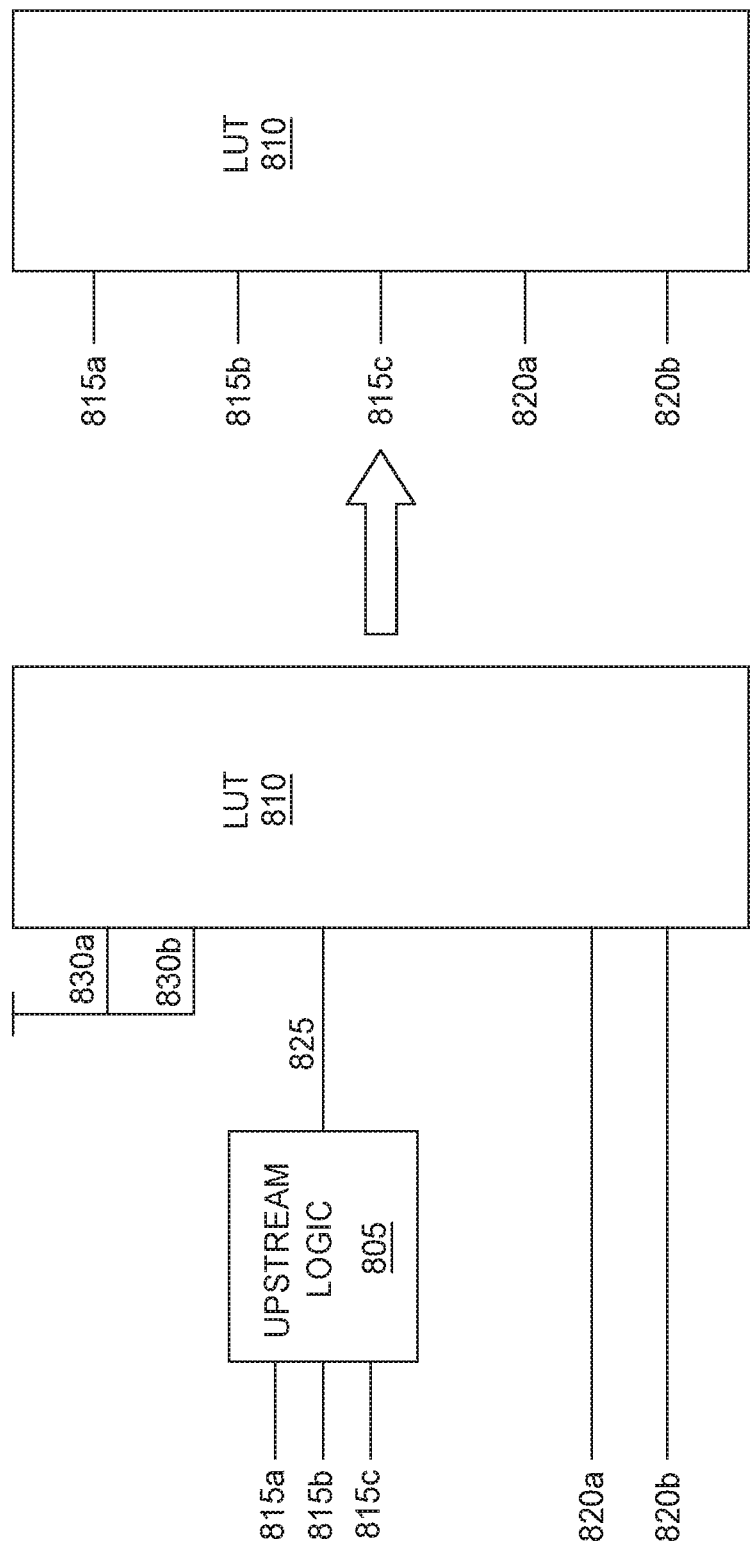
FIG. 8 illustrates a fallback mechanism for the method for optimizing a circuit design for an IC, in accordance with an example of the present disclosure.

As illustrated, FIG. 8 shows an example mapping of inputs of the upstream logic 805 to the programmable LUT 810. As illustrated, the optimizer can identify that the input signals 815 going into the upstream logic 805 as a combination of inputs that may be directly connected to the programmable LUT 810. The optimizer determines the available inputs 830 of the programmable LUT 810, which in FIG. 8 are 2 inputs. The optimizer also determines that the programmable LUT 810 can accommodate the combination of inputs, as illustrated in FIG. 8, by mapping input signals 815 to inputs 825, 830. Thus, the optimizer has mapped a plurality of input signals 815 and input signals 820*a*, 820*b* to the programmable LUT 810.

In some examples, the optimizer can apply a single-output LUT mapping algorithm to the netlist. In some examples, when applying the mapping algorithm, the optimizer applies costs to different combinations of inputs in order to determine a combination of inputs to map to the inputs of the programmable LUT. The optimizer can generate LUTs from the upstream logic based on the determined combination of inputs. The number of inputs to the generated LUTs can be smaller than the number of inputs to the programmable LUT. With these generated LUTs, the optimizer can combine these generated LUTs with the programmable LUT.

In one embodiment, the optimizer may need to comply with other hard input constraints and may need to accommodate cascading logic. Depending on the hardware of the programmable IC, the netlist can include hard input constraints and cascading logic. Cascading logic can be any number and combination of logic elements where the output of one logic element is an input into another logic element. In some examples, the hard input constraints and cascading logic can require an input of the programmable LUT to be connected to a particular signal. To comply with any requirements of the hard input constraints and cascading logic, the optimizer can preserve related logic elements and/or structures from optimizations that restructure the logic elements. For example, the optimizer can preserve a cascading logic chain (e.g., a chain of multiplexers) before mapping and applying constant propagation optimizations to the cascading logic chain. This preservation maximizes the possibility of mapping particular input signals of the upstream logic to a particular input of the programmable LUT. In some examples, the optimizer can apply costs to penalize combinations of inputs that do not include constrained inputs.

The optimizer may combine LUTs in the upstream logic with the programmable LUT to optimize the netlist. To determine a valid and legal combination of the upstream LUTs with the programmable LUT, the optimizer may apply constraints on the combination of signals between the upstream LUTs and the programmable LUT. For example, the optimizer may require that the number of inputs to the upstream LUTs be less than the total number of inputs to the programmable LUT. In another example, at least one input to the upstream LUTs may be connected to the input port for the selector signal of a multiplexer of the programmable LUT.

Returning to FIG. 3, at 315, the optimizer validates the mapped inputs by monitoring the multiple outputs of the programmable LUT. Details about validating the mapped input signals are described with reference to FIG. 5.

Figure 5:
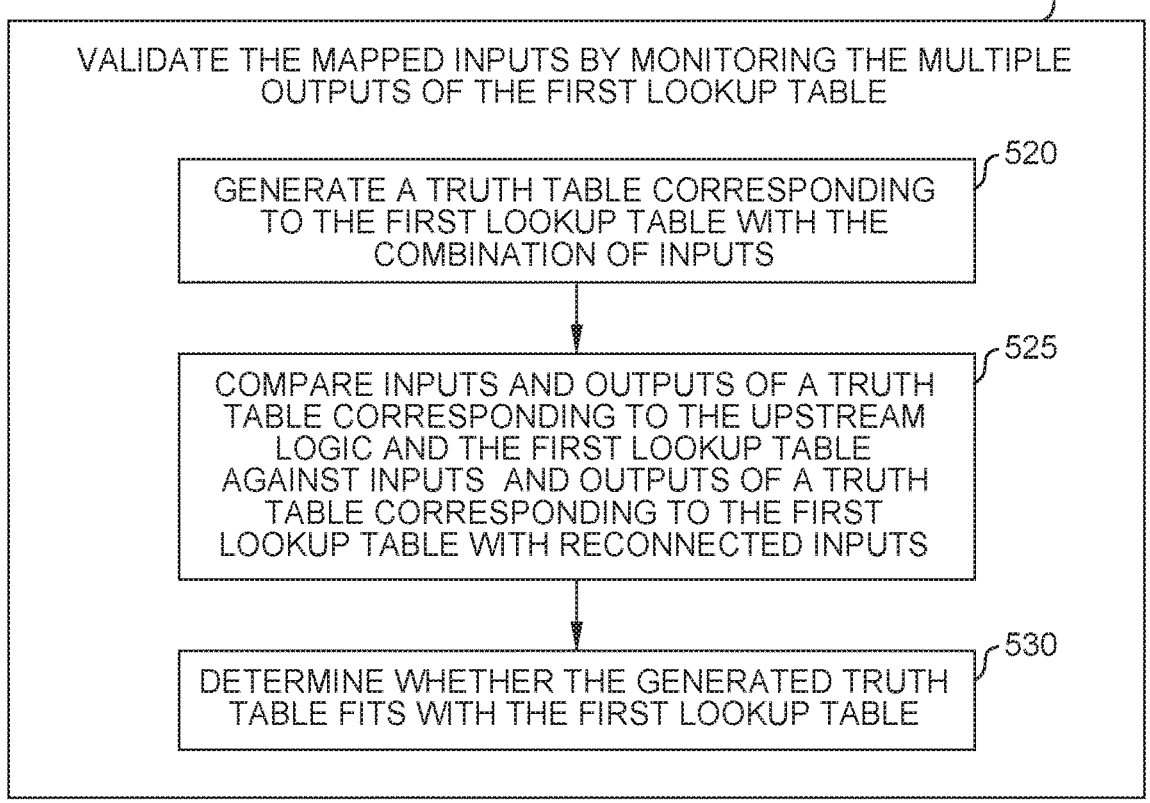
FIG. 5 is a flow diagram depicting further details of optimizing a circuit design for an IC, in accordance with an example of the present disclosure.

FIG. 5 is a flow diagram illustration operations performed by the optimizer to validate (validating 315 of FIG. 3) the plurality of the input signals to inputs of the programmable LUT.

To validate the mapped inputs, at 520, the optimizer can generate a truth table corresponding to the programmable LUT with the combination of inputs. The generated truth tables produces outputs based on inputs signals from the combination of inputs.

At 525, the optimizer compares inputs and outputs of the generated truth table against inputs and outputs of the upstream logic and the programmable LUT. For example, an input going into upstream logic generates a particular output from the programmable LUT. The same input to the generated truth table needs to be the same as the particular output from the programmable LUT. By comparing inputs and outputs before and after mapping, the optimizer determines whether the mapped inputs result in the same outputs from the programmable LUT if the inputs had been to the upstream logic. If any of the mapped inputs results in different outputs, then the validation fails. If the mapped inputs results in the same outputs, then the validation is successful and the optimizer continues to 330 of FIG. 3.

At 530, the optimizer determines whether the generated truth table fits with the programmable LUT by determining whether the internal logical structure of the programmable LUT can support the generated truth table and generate the corresponding output from the input. If the generated truth tables does not fit with the programmable LUT, then the validation fails. If the generated truth table does fit with the programmable LUT, then the optimizer has successfully validated the mapped inputs.

Returning to FIG. 3, at 320, the optimizer determines whether validation was successful. If validation failed, the optimizer may have determined that upstream logic cannot be combined with the programmable LUT. If the validation succeeds, then at 430, the optimizer optimizes the netlist by removing the upstream logic and reconnecting the plurality of input signals to the inputs of the programmable LUT.

In some examples, after reconnecting the input signals to the programmable LUT, the optimizer can generate a truth table for the reconnected LUT. To do so, the optimizer can perform a pseudo simulation of inputs into the reconnected LUT. The pseudo simulation can involve enumerating all possible input combinations. The number of possible input combinations may be $2^{number\ of\ inputs}$. After enumerating all possible input combinations, the optimizer evaluates if the generated truth table still satisfies input constraints and/or requirements for the programmable LUT and the upstream logic. If the generated truth table satisfies input constraints and/or requirements, then the optimizer can use the reconnected LUT in the optimized netlist 135.

The optimization techniques disclosed herein may result in a reproducible QoR gain and in a reduction of the number of LUTs in the netlist of the circuit design.

Figure 9:
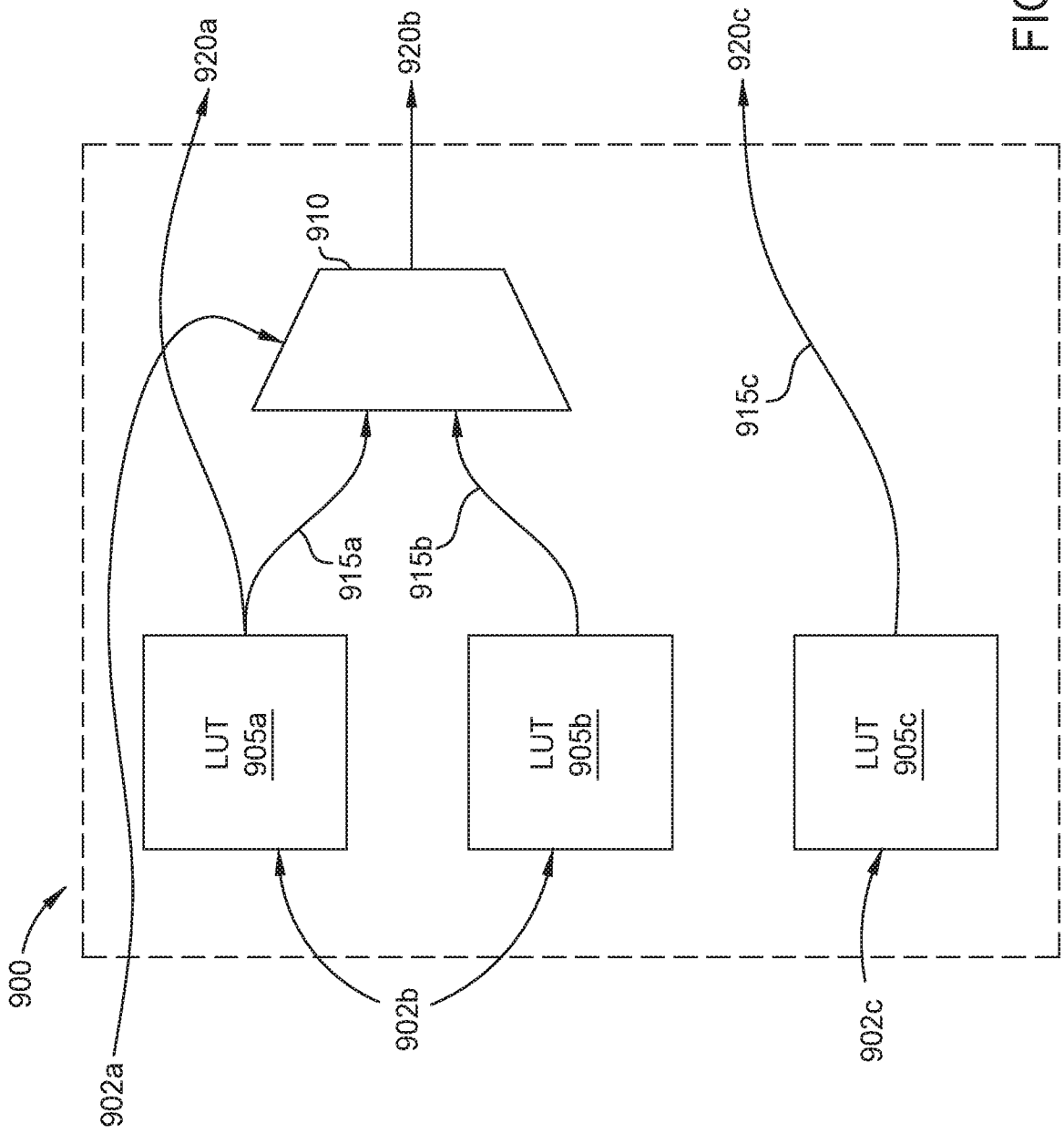
FIG. 9 illustrates the internal structure of a programmable lookup table, in accordance with an example of the present disclosure.

FIG. 9 illustrates the internal logical structure of a programmable LUT 900, according to some examples. In some examples, the programmable LUT 900 is a multiple-input and multiple-output LUT where some of the multiple outputs are correlated and thus a constraint on the optimization process. The programmable LUT 900 comprises internal LUTs 905*a*, 905*b*, 905*c* (collectively internal LUTs 905), each of which receives at least one input, and a multiplexer 910. Two of the internal LUTs 905a, 905b have outputs that are the inputs to the multiplexer 910. The multiplexer 910 can also receive an input signal 902a that acts as a selector signal for the inputs from the internal LUTs 905a, 905b. Accordingly, at least one output of the programmable LUT 900 is dependent on the selector signal 902a, and this dependency may be a constraint on optimization. The other outputs of the programmable LUT 900 may be independent of the selector signal 902a and thus also a constraint on the optimization process.

As illustrated, the programmable LUT 900 can take in several input signals and can output multiple outputs based on how the input signals pass through the programmable LUT's internal structure. For example, the input signals can be input signals 902a, 902b, and 902c and the programmable LUT 900 generates the output signals 920a, 920b, and 920c. The input signals 902b, 902c go to the internal LUTs 905 and each of the internal LUTs 905 generates an internal signal 915a, 915b, 915c (collectively internal signals 915). The internal signals 915 may be directly connected to the outputs of the programmable LUT, and are thus independent of any other input signal. As illustrated, the output 920a and the output 920c may be independent of 920a input signal because the outputs of the internal LUTs 905a, 905c are directly connected to these outputs. The internal signals may be connected to internal structures, such as the multiplexer 910, and may be dependent on another input signal, such as the input signal 902a. For example, the output of the multiplexer 910 which is connected to the output 920b is dependent on the input signal 920a, which acts as a selector signal between the internal signals 915a, 915b. In some examples, an internal signal (e.g., 915a) may be connected to another internal structure (e.g., multiplexer 910) and to an output (e.g., output signal 920a).

As mentioned, the multiplexer 910 uses the input signal 902a to select one of the internal signals from the internal LUTs 905a, 905b. The 920a output and 920b output may be identical when the input 902a is zero. If the input 902a is 1 then the 920a output and the 920b output may be different. As illustrated, the internal logical structure of the programmable LUT 900 may provide constraints to the input signals, thus the optimizer may need to consider these constraints based on the internal logical structure of the programmable LUT during optimization.

Figure 10:
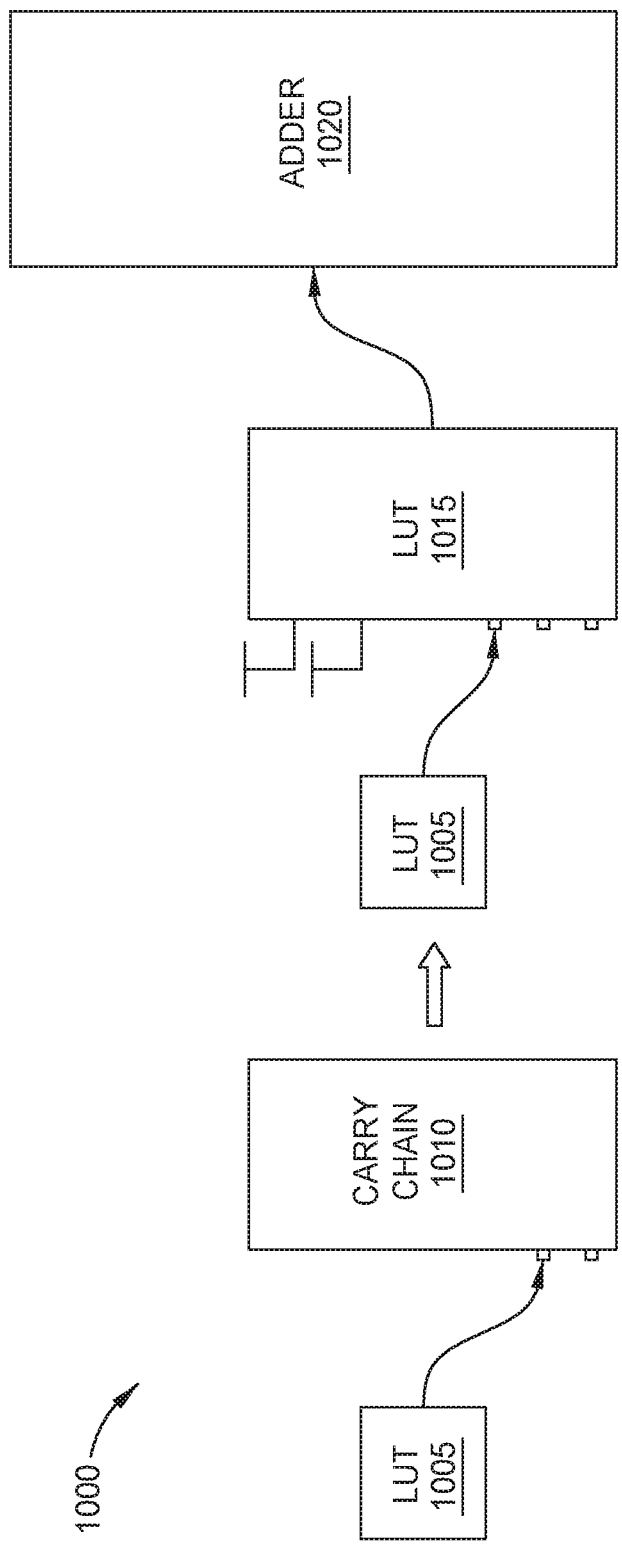
FIG. 10 illustrates restructuring logic elements based on the architecture of an IC device, according to one example.

FIG. 10 illustrates restructuring logic elements based on the architecture of an IC device, according to one example. As mentioned, logic elements which were previously part of a hardened carry-chain circuit may be mapped to a programmable fabric (e.g., a programmable LUT) of the IC device. These logic elements may be restructured into different logic elements in a particular order in order to achieve the same functionality of the logic elements prior to the restructuring. For example, as illustrated in FIG. 10, a carry chain 1010 may be restructured into a LUT 1015 and an adder 1020, where the output of the LUT 1015 connects to the input of the adder 1020, in order to achieve the same functionality as the carry chain 1010. Restructuring of logic elements may depend on the architecture of the IC device, so restructuring of logic elements may occur during synthesis of the circuit design. At the end of restructuring, the inputs into logic elements prior to the restructuring may be directly connected to the restructured logic elements after the restructuring. For example, the inputs of the LUT 1005 may be directly connected to the LUT 1015 resulting from the restructuring. Accordingly, the optimization techniques disclosed herein can apply to these restructured logic elements and any requirements imposed by the structure of these logic elements.

Figure 11:
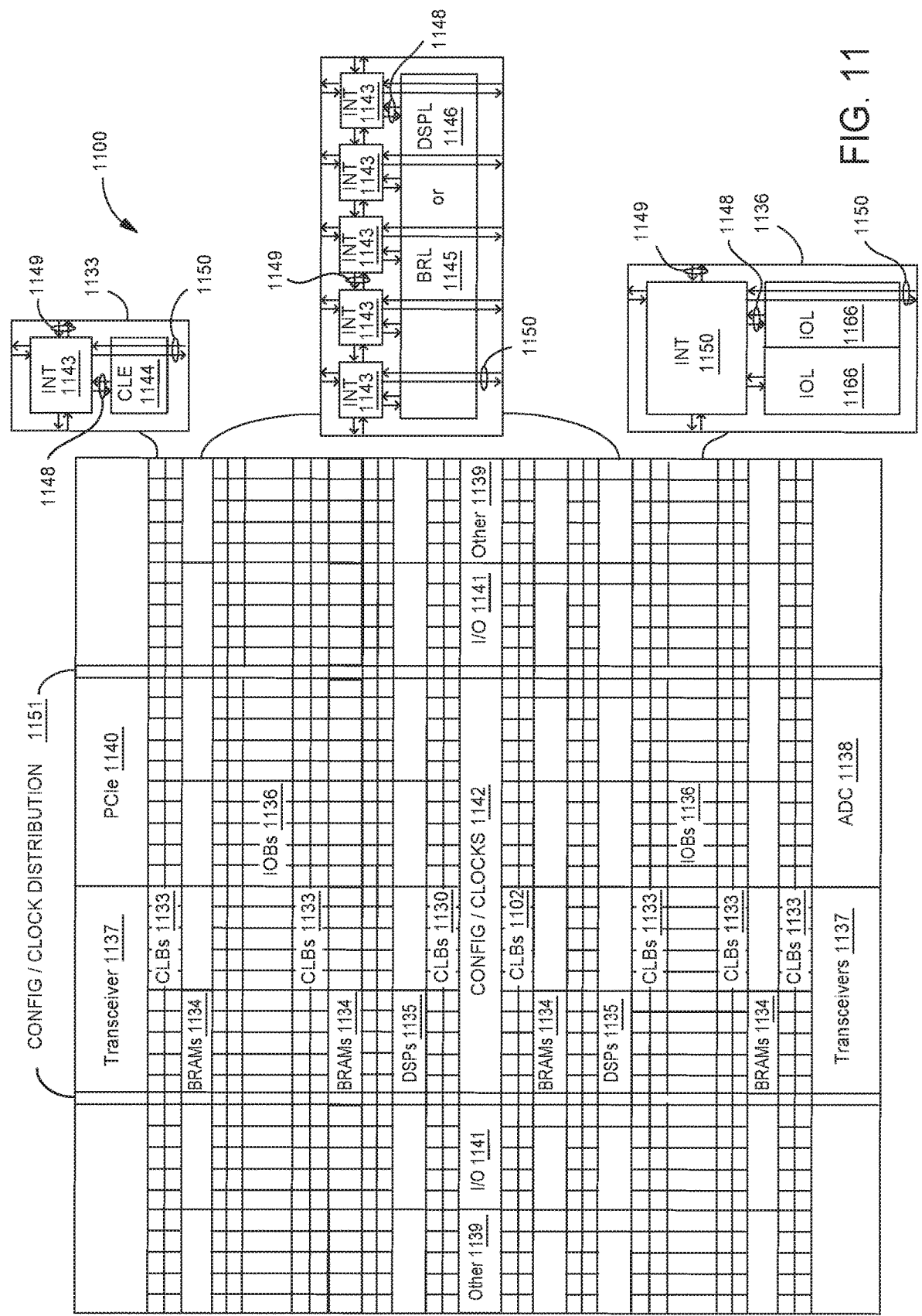
FIG. 11 illustrates a field programmable gate array (FPGA) that can be evaluated for compatibility with user designs, according to one example.

FIG. 11 illustrates an FPGA 1100 implementation of a programmable IC that can implement the circuit design represented by the optimized netlist. In some examples, FPGA 1100 includes a large number of different programmable tiles including transceivers 1137, CLBs 1133, BRAMs 1134, input/output blocks ("IOBs") 1136, configuration and clocking logic ("CONFIG/CLOCKS") 1142, DSP blocks 1135, specialized input/output blocks ("I/O") 1141 (e.g., configuration ports and clock ports), and other programmable logic 1139 such as digital clock managers, analog-to-digital converters, system monitoring logic, and so forth. The FPGA can also include PCIe interfaces 1140, analog-to-digital converters (ADC) 1138, and the like.

In some FPGAs, each programmable tile can include at least one programmable interconnect element ("INT") 1143 having connections to input and output terminals 1148 of a programmable logic element within the same tile, as shown by examples included at the top of FIG. 11. Each programmable interconnect element 1143 can also include connections to interconnect segments 1149 of adjacent programmable interconnect element(s) in the same tile or other tile(s). Each programmable interconnect element 1143 can also include connections to interconnect segments 1150 of general routing resources between logic blocks (not shown). The general routing resources can include routing channels between logic blocks (not shown) comprising tracks of interconnect segments (e.g., interconnect segments 1150) and switch blocks (not shown) for connecting interconnect segments. The interconnect segments of the general routing resources (e.g., interconnect segments 1150) can span one or more logic blocks. The programmable interconnect elements 1143 taken together with the general routing resources implement a programmable interconnect structure ("programmable interconnect") for the illustrated FPGA.

In an example implementation, a CLB 1133 can include a configurable logic element ("CLE") 1144 that can be programmed to implement user logic plus a single programmable interconnect element ("INT") 1143. A BRAM 1134 can include a BRAM logic element ("BRL") 1145 in addition to one or more programmable interconnect elements. Typically, the number of interconnect elements included in a tile depends on the height of the tile. In the pictured example, a BRAM tile has the same height as five CLBs, but other numbers (e.g., four) can also be used. A DSP tile 1135 can include a DSP logic element ("DSPL") 1146 in addition to an appropriate number of programmable interconnect elements. An IOB 1136 can include, for example, two instances of an input/output logic element ("IOL") 1147 in addition to one instance of the programmable interconnect element 1143. As will be clear to those of skill in the art, the actual I/O pads connected, for example, to the I/O logic element 1147 typically are not confined to the area of the input/output logic element 1147.

In the pictured example, a horizontal area near the center of the die (shown in FIG. 11) is used for configuration, clock, and other control logic. Vertical columns 1151 extending from this horizontal area or column are used to distribute the clocks and configuration signals across the breadth of the FPGA.

Some FPGAs utilizing the architecture illustrated in FIG. 11 include additional logic blocks that disrupt the regular columnar structure making up a large part of the FPGA. The additional logic blocks can be programmable blocks and/or dedicated logic.

Note that FIG. 11 is intended to illustrate only an exemplary FPGA architecture. For example, the numbers of logic blocks in a row, the relative width of the rows, the number and order of rows, the types of logic blocks included in the rows, the relative sizes of the logic blocks, and the interconnect/logic implementations included at the top of FIG. 11 are purely exemplary. For example, in an actual FPGA more than one adjacent row of CLBs is typically included wherever the CLBs appear, to facilitate the efficient implementation of user logic, but the number of adjacent CLB rows varies with the overall size of the FPGA.

In some examples, the programmable tiles of the FPGA 1100 (as described above) each include bits of configuration memory. The FPGA 1100 can further include a configuration subsystem (e.g., a CFRAME subsystem) for configuring or programming the programmable tiles. In some examples, a CFRAME subsystem can receive configuration data for the programmable tiles of the FPGA 1100 and can function as the configuration controller for configuring or programming the programmable tiles of the FPGA 1100.

The above described FPGA is provided herein as an example of an integrated circuit device or a PLD to provide context to various methods described herein. Other types of integrated circuit devices and PLDs may be implemented in different methods.

The various examples described herein may employ various computer-implemented operations involving data stored in computer systems. For example, these operations may require physical manipulation of physical quantities usually, though not necessarily, these quantities may take the form of electrical or magnetic signals, where they or representations of them are capable of being stored, transferred, combined, compared, or otherwise manipulated. Further, such manipulations are often referred to in terms, such as producing, identifying, determining, or comparing. Any operations described herein that form part of one or more examples may be implemented as useful machine operations. In addition, one or more examples also relate to a device or an apparatus for performing these operations. The apparatus may be specially constructed for specific required purposes, or it may be a general purpose computer selectively activated or configured by a computer program stored in the computer. In particular, various general purpose machines may be used with computer programs written in accordance with the teachings herein, or it may be more convenient to construct a more specialized apparatus to perform the required operations.

One or more examples may be implemented as one or more computer programs or as one or more computer program modules embodied in one or more computer readable media. The term computer readable medium refers to any data storage device that can store data which can thereafter be input to a computer system computer readable media may be based on any existing or subsequently developed technology for embodying computer programs in a manner that enables them to be read by a computer. Examples of a computer readable medium (e.g., a non-transitory storage medium) include a hard drive, a Solid State Disk (SSD), network attached storage (NAS), read-only memory, random-access memory (e.g., a flash memory device), a CD (Compact Discs) CD-ROM, a CD-R, or a CD-RW, a DVD (Digital Versatile Disc), a magnetic tape, and other optical and non-optical data storage devices. The computer readable medium can also be distributed over a network coupled computer system so that the computer readable code is stored and executed in a distributed fashion.

The methods disclosed herein comprise one or more steps or actions for achieving the methods. The method steps and/or actions may be interchanged with one another without departing from the scope of the claims. In other words, unless a specific order of steps or actions is specified, the order and/or use of specific steps and/or actions may be modified without departing from the scope of the claims. Further, the various operations of methods described above may be performed by any suitable means capable of performing the corresponding functions. The means may include various hardware and/or software component(s) and/or module(s), including, but not limited to a circuit, an application specific integrated circuit (ASIC), or processor. Generally, where there are operations illustrated in figures, those operations may have corresponding counterpart means-plus-function components with similar numbering.

While the foregoing is directed to specific examples, other and further examples may be devised without departing from the basic scope thereof, and the scope thereof is determined by the claims that follow.

What is claimed is:

1. A method, the method comprising:
    receiving a netlist comprising a first lookup table and upstream logic, wherein the upstream logic receives a plurality of input signals and comprises at least one output connected to at least one input of the first lookup table, and wherein the first lookup table comprises an unused input and multiple outputs;
    mapping the plurality of input signals of the upstream logic directly to the at least one input and the unused input of the first lookup table;
    validating the mapping by monitoring the multiple outputs of the first lookup table; and
    upon a successful validation, optimizing the netlist by removing the upstream logic and reconnecting the plurality of input signals to the at least one input and the unused input of the first lookup table.

2. The method of claim 1, further comprising: anchoring the at least one output of the upstream logic by inserting a plurality of buffers into the netlist for preserving the at least one output of the upstream logic.

3. The method of claim 2, wherein a number of anchored signals equals a number of unused inputs to the first lookup table.

4. The method of claim 1, wherein the upstream logic comprise a second lookup table.

5. The method of claim 1, further comprising:
    upon an unsuccessful validation:
        generating a buffer lookup table to act as a feedthrough for outputs of the upstream logic; and
        optimizing the netlist by removing the upstream logic and reconnecting the plurality of input signals of the upstream logic to the at least one input and the unused input of the first lookup table.

6. The method of claim 1, wherein at least two outputs of the first lookup table are correlated.

7. The method of claim 6, wherein the at least two outputs are identical when an input signal into the first lookup table is zero.

8. The method of claim 1, further comprising: generating a truth table for the first lookup table by enumerating input combinations.

9. The method of claim 1, wherein mapping the plurality of inputs comprises:
    identifying a combination of inputs of the plurality of inputs;

determining a number of unused inputs of the first lookup table; and determining whether the unused inputs of the first lookup table can accommodate the combination of inputs.

10. The method of claim 1, wherein the upstream logic comprises a second lookup table.

11. The method of claim 10, wherein validating the mapping comprises determining whether a number of inputs to the second lookup table is equal to or less than a number of unused inputs to the first lookup table.

12. The method of claim 1, wherein the mapping comprises:

mapping each combination of the plurality of input signals of the upstream logic to the at least one input and the unused input of the first lookup table; and applying costs to each combination based on buffers anchoring the plurality of signals.

13. The method of claim 1, wherein the mapping comprises generating truth tables for each output of the first lookup table.

14. The method of claim 1, wherein validating the mapping comprises comparing inputs and outputs of a truth table corresponding to the upstream logic and the first lookup table against inputs and outputs of a truth table corresponding to the first lookup table with reconnected inputs.

15. A non-transitory computer-readable medium storing instructions, which when executed by one or more processors, cause the one or more processors to perform operations, the operations comprising:

receiving a netlist comprising a first lookup table and upstream logic, wherein the upstream logic receives a plurality of input signals and comprises at least one output connected to at least one input of the first lookup table, and wherein the first lookup table comprises an unused input and multiple outputs;

mapping the plurality of input signals of the upstream logic directly to the at least one input and the unused input of the first lookup table;

validating the mapping by monitoring the multiple outputs of the first lookup table; and upon a successful validation, optimizing the netlist by removing the upstream logic and reconnecting the plurality of input signals of the upstream logic to the at least one input and the unused input of the first lookup table.

16. The non-transitory computer-readable medium of claim 15, wherein the operations further comprise:

upon an unsuccessful validation:

generating a buffer lookup table to act as a feedthrough for outputs of the upstream logic; and optimizing the netlist by removing the upstream logic and reconnecting the plurality of input signals of the upstream logic to the at least one input and the unused input of the first lookup table.

17. The non-transitory computer-readable medium of claim 15, wherein the operations further comprise: generating one or more upstream lookup tables from the upstream logic based on a combination of the plurality of input signals of the upstream logic.

18. The non-transitory computer-readable medium of claim 17, wherein a number of input signals to the one or more upstream lookup tables is smaller than a number of inputs of the first lookup table.

19. A system, comprising:

at least one processor; and a memory coupled to the at least one processor, the memory comprising code executable by the at least one processor to perform an operation, the operation comprising:

receiving a netlist comprising a first lookup table and upstream logic, wherein the upstream logic receives a plurality of input signals and comprises at least one output connected to at least one input of the first lookup table, and wherein the first lookup table comprises an unused input and multiple outputs;

mapping the plurality of input signals of the upstream logic directly to the at least one input and the unused input of the first lookup table;

validating the mapping by monitoring the multiple outputs of the first lookup table; and upon a successful validation, optimizing the netlist by removing the upstream logic and reconnecting the plurality of input signals of the upstream logic to the at least one input and the unused input of the first lookup table.

20. The system of claim 19, wherein the operation further comprises:

upon an unsuccessful validation:

generating a buffer lookup table to act as a feedthrough for outputs of the upstream logic; and optimizing the netlist by removing the upstream logic and reconnecting the plurality of input signals of the upstream logic to the at least one input and the unused input of the first lookup table.

* * * * *